US010326383B2

(12) United States Patent
Stiebel et al.

(10) Patent No.: US 10,326,383 B2
(45) Date of Patent: Jun. 18, 2019

(54) METHOD AND DEVICE FOR CONTROLLING A PIEZOELECTRIC MOTOR

(71) Applicant: PHYSIK INSTRUMENTE (PI) GMBH & CO. KG, Karlsruhe (DE)

(72) Inventors: Christoph Stiebel, Waldbronn (DE); Alexej Wischnewski, Wörth (DE); Dieter Wienecke, Landolfshausen (DE); Kurt Sinske, Gleichen (DE)

(73) Assignee: PHYSIK INSTRUMENTE (PI) GMBH & CO. KG, Karlsruhe (DE)

( * ) Notice: Subject to any disclaimer, the term of this patent is extended or adjusted under 35 U.S.C. 154(b) by 0 days.

(21) Appl. No.: 15/534,377

(22) PCT Filed: Oct. 23, 2015

(86) PCT No.: PCT/EP2015/074588
§ 371 (c)(1),
(2) Date: Jun. 8, 2017

(87) PCT Pub. No.: WO2016/091443
PCT Pub. Date: Jun. 16, 2016

(65) Prior Publication Data

US 2018/0006583 A1 Jan. 4, 2018

(30) Foreign Application Priority Data

Dec. 8, 2014 (DE) ........................ 10 2014 225 154

(51) Int. Cl.
*H02N 2/00* (2006.01)
*H03H 9/13* (2006.01)

(52) U.S. Cl.
CPC .......... *H02N 2/0075* (2013.01); *H02N 2/008* (2013.01); *H03H 9/13* (2013.01)

(58) Field of Classification Search
CPC ............ H02K 17/14; H02K 3/12; H02K 3/28; H02K 3/51; H02P 25/20; H02P 27/06
See application file for complete search history.

(56) References Cited

U.S. PATENT DOCUMENTS 6,121,717 A * 9/2000 Diefenbach ............ B26B 19/28 310/323.02
6,747,391 B1 6/2004 Ben-Yaakov
(Continued)

FOREIGN PATENT DOCUMENTS

DE 10 2005 039 358 A1 3/2007
DE 10 2011 087 542 B3 4/2013
(Continued)

OTHER PUBLICATIONS

International Search Report (PCT/ISA/210) dated Feb. 10, 2016, by the European Patent Office as the International Searching Authority for International Application No. PCT/EP2015/074588.
(Continued)

*Primary Examiner* — Muhammad S Islam
(74) *Attorney, Agent, or Firm* — Buchanan Ingesoll & Rooney PC

(57) ABSTRACT

A method and device are disclosed for actuating a piezo-electric motor by two driving electrodes by applying periodic control voltages to the driving electrodes. A simplified closed-loop control of the piezoelectric motor is realized by reducing the static friction of a friction contact between a friction element of the piezo-electric motor and an output element to be driven by the friction element without a propulsion of the output element at the same time. In exemplary embodiments, the periodic control voltages are applied with a phase shift to the driving electrodes in a first
(Continued)

step of the method, and in a second step of the method, the amplitude ratio of the periodic control voltages is changed with respect to the first step.

14 Claims, 3 Drawing Sheets

(56) References Cited

U.S. PATENT DOCUMENTS

| | | | | |
|---|---|---|---|---|
| 6,806,620 | B1 * | 10/2004 | Wischnewskiy | H01L 41/0913 310/323.02 |
| 7,075,211 | B1 | 7/2006 | Ganor et al. | |
| 7,211,929 | B2 | 5/2007 | Ganor et al. | |
| 7,701,116 | B2 | 4/2010 | Atsuta | |
| 2003/0052628 | A1 * | 3/2003 | Kataoka | H02N 2/142 318/114 |
| 2006/0175930 | A1 | 8/2006 | Ganor et al. | |
| 2007/0108870 | A1 * | 5/2007 | Atsuta | H02N 2/008 310/317 |
| 2010/0013353 | A1 | 1/2010 | Wischnewskij et al. | |

FOREIGN PATENT DOCUMENTS

| | | | |
|---|---|---|---|
| JP | 2003501988 | A | 1/2003 |
| JP | 2007143231 | A | 6/2007 |
| JP | 2011254661 | A | 12/2011 |
| WO | 0074153 | A1 | 12/2000 |

OTHER PUBLICATIONS

Written Opinion (PCT/ISA/237) dated Feb. 10, 2016, by the European Patent Office as the International Searching Authority for International Application No. PCT/EP2015/074588.

Office Action dated Jul. 7, 2015, by the German Patent and Trademark for Patent Application No. DE 10 2014 225 154.0.

Office Action (Notice of Grounds of Rejection) dated Jun. 19, 2018, by the Japanese Patent Office in corresponding Japanese Patent Application No. 2017-548521, and an English Translation of the Office Action. (7 pages).

Office Action dated May 3, 2018, by the European Patent Office in corresponding European Patent Application No. 15 784 687.4. (4 pages).

First Office Action dated Aug. 3, 2018, by the State Intellectual Property Office of P.R.C. in Chinese Patent Application No. 201580066509.9, and an English translation of the Office Action (12 pages).

* cited by examiner

METHOD AND DEVICE FOR CONTROLLING A PIEZOELECTRIC MOTOR

The invention relates to a method and a device for controlling a piezoelectric motor by way of two driving electrodes by applying periodic control voltages to the driving electrodes. The invention relates in particular to the field of piezoelectric ultrasonic motors which are preferably operated in the frequency range above 20 kHz.

A piezoelectric motor with two driving electrodes, which are fed by periodic control voltages from two separate voltage sources, is known, for example, from (FIG. 1) of U.S. Pat. No. 6,747,391 B1.

A piezoelectric motor generally operates according to the principle that a specific periodic deformation of a piezoceramic element (actuator) is generated by applying periodic control voltages to its driving electrodes. This deformation is transmitted via a so-called friction element (friction lug) to an output element being in frictional contact therewith in order to generate a propulsion of this output element. The deformation there causes a specific path of motion of the friction element, which generally has an elliptical shape, where the main axis of the ellipse has an inclination in the direction into which the output element is to be moved. The secondary axis of the ellipse can there as an exception be so small that the path of motion of the friction element in a first approximation has a linear or straight shape. The respective motion of the friction element leads to a short pulse acting on the output element with a speed component which points in the driving direction of the output element. The corresponding repeating pulses in their entirety lead to the desired motion of the output element.

Due to the locally and temporally varying engagement and/or static friction states between the friction element and the surface of the output element being in contact therewith (hereinafter also referred to as a friction surface), it can occur that the output element of the ultrasound motor can, when applying a voltage of a certain amplitude, at one time move as desired, while, on the other hand, it remains stopped at another time. Ultimately, this is a non-linearity or hysteresis with respect to the controlling voltage-speed characteristic or transfer characteristic.

In the above-mentioned case, in which the output element remains stopped at a certain controlling voltage, the engagement and/or static friction states are such that the voltage applied or its amplitude, respectively, is not sufficient to release the friction element from its static friction or the engagement state between itself and the friction surface or to produce the respectively required breakaway torque or the breakaway voltage.

A threshold amplitude of the voltage there exists, above which a motion of the output element results irrespective of the engagement or static friction states. The threshold amplitude of the voltage is there generally relatively high, which results in certain drawbacks. Because high voltage leads, firstly, to high energy consumption, but secondly, to correspondingly high energy input into the system of the ultrasonic actuator with the friction element and the output element. This high energy input leads to the system composed of the ultrasonic actuator and the output element being quasi mechanically pre-tensioned prior to the actual motion of the output element, and when starting the motion of the output element, the latter experiences correspondingly high acceleration which is difficult to control in terms of control technology, in particular where only short operating displacement are to be achieved or the output element is to be moved at a very low speed. At higher drive speeds, the ultrasonic motor can despite the non-linearity or hysteresis continuing to exist with respect to the transfer characteristic be comparatively easy to control by variation of the amplitude of the controlling voltage, whereas at low drive speeds, i.e. less than 1 mm/s, it is difficult to prevent the motor from entering the regime of the breakaway torque or the breakaway voltage, which can ultimately lead to vibrations and positional errors.

The correspondingly high non-linearity of the transfer characteristic, which has so-called dead regions in the regime of the breakaway voltage, is the crucial problem for position-controlled operation of piezoelectric ultrasonic motors.

The invention is therefore based on the object of providing a method for controlling a piezoelectric motor, by way of which simplified position control is possible, in particular at slow drive speeds. The invention is further based on the object of providing a corresponding device for controlling a piezoelectric motor.

According to a first aspect of the invention, the above-mentioned object is satisfied by the method according to claim 1. A method is disclosed for controlling a piezoelectric motor by way of at least two driving electrodes by applying periodic control voltages to the driving electrodes, wherein in a first step of the method periodic control voltages are applied with a phase shift to the driving electrodes, and in a second step of the method, the amplitude ratio of the periodic control voltages is changed with respect to the first step.

The phase shift between the two periodic control voltages in the first step of the method leads to a vibration of the friction element substantially along the path of motion of the output element to be driven, so that the frictional contact between the drive and the output is released from its static friction (so-called compensating vibration). In contrast to in-phase excitation of the two driving electrodes, which causes vibration of the friction element on a highly eccentric elliptical path with its main axis perpendicular to the friction surface, the phase-shifted actuation also has the advantage of a barely existing or lower vibration component perpendicular to the friction surface which significantly reduces undesired natural vibration of the output.

In the second step of the method, the inclination of the vibration path of the friction element is changed by varying the amplitude ratio of the periodic control voltages with respect to the first step in order to adjust the propulsion of the output element. Reduction of the non-linear static friction transitions and, in particular, the associated hysteresis of the transfer characteristic equal linearization of the closed-loop controlled system, so that a significant improvement is achieved over previous methods.

A similar phenomenon is known from practice: an object positioned on a vibrating support (e.g. a washing machine, a dashboard of a moving vehicle, etc.) can be moved with respect to the support with minimal force acting, since no or negligibly small adhesion force between the object and the support is given due to the vibration of the support.

Advantageous developments of the invention are objects of the dependent claims.

Preferably, in the first step of the method, the phase shift and/or the amplitude ratio of the periodic control voltages are adjusted in such a manner that a friction element of the piezoelectric motor is excited to vibrate along a vibration path which extends substantially tangential or exactly tangential to a friction surface of an output element to be driven by the friction element. In the first step of the method, the vibration path of the friction element runs preferably horizontal and/or parallel to the longitudinal edge side and/or to at least one of the flat sides of the piezoceramic element (actuator). When the output element runs on a horizontal path of motion and no deflecting forces are applied, then the output element is in this case in force equilibrium along its degrees of freedom of movement and floats almost without contact to the friction element on the spot without moving. In the "floating state", the output element is in force equilibrium, i.e. the sum of forces exerted along the degrees of freedom of movement of the output element adds to zero. In this so-called "floating state", an extremely small pulse already suffices to move the output element in a certain direction. By slightly tilting the main axis of the vibration path of the friction element, which is achieved by adjusting the amplitude ratio of the periodic control voltages, the output element can also be moved from this so-called "floating state" over short distances at a low speed. A positional error of the output element can therefore be minimized also for short operating displacement and/or low speeds.

It can be advantageous in the first step of the method to have the phase shift and/or the amplitude ratio of the periodic control voltages be adjusted such that friction contact between a friction element of the piezoelectric motor and an output element to be driven by the friction element is released from its static friction, without a propulsion of the output element at the same time. It is within the scope of the invention not only to take into account the simple case that the friction surface or the path of motion of the output element to be driven is aligned exactly horizontally and no deflecting forces act upon the output element to be driven. However, for example, the force of gravity or other forces (for example, pretension by a spring) can act upon the output element, e.g. when the friction surface or the path of motion of the output element is inclined. An inversely phased excitation of the driving electrodes (phase shift=180°), with the frequency (e.g., 156 kHz) and the amplitude (i.e., the amplitude ratio=1) being the same, releases the frictional contact between the output and the drive from the static friction. The output element would move due to the deflecting forces, because when the static friction is released, the sum of the acting forces along the degrees of freedom of movement of the output element is not equal to zero. This deflecting force can be compensated by selective actuation of the driving electrodes with a specific amplitude ratio and/or a specific phase shift of the periodic control voltages so that the forces acting upon the output element along the degrees of freedom of movement of the output element add up to zero. According thereto, it might depending on the respective ultrasonic motor system be necessary to adjust the phase shift and/or the amplitude ratio of the control voltages to be applied to the driving electrodes in order to generate a force counteracting the deflecting force so that the output element is held in the "floating state" without propulsion.

It can additionally be advantageous to alter in the second step of the method the phase shift and/or the amplitude ratio of the periodic control voltages with respect to the first step in such a manner that the vibration path of the friction element is inclined with respect to the first step and thereby creates a propulsion of the output element. As a result, the speed and the direction of motion of the output element can be influenced.

It can additionally be useful if the periodic control voltages are in the first step and/or in the second step of the method applied to the driving electrodes with a constant phase shift, where the phase shift is preferably substantially equal to 180° or exactly equal to 180°. The phase shift of 180° between the two periodic control voltages in the case of equal amplitudes and the same specific frequency (for example, 156 kHz) leads to vibration of the friction element on a highly eccentric elliptical path with its main axis being tangential to the friction surface. Due to this high-frequency vibration tangential to the friction surface, the frictional contact is released from its static friction without producing propulsion at the same time. While maintaining the constant phase shift between the periodic control voltages, the inclination of the vibration path of the friction element of the piezoelectric motor can be altered in a selective manner by changing the amplitude ratio of the periodic control voltages without obtaining any possibly undesired further motion component.

It can further be advantageous if the amplitude ratio of the periodic control voltages is in the first step of the method constant, preferably substantially equal to 1 or exactly equal to 1. If the friction surface and the path of motion of the output element extend horizontally and no deflecting forces act upon the output element, then the non-propulsive floating state is achieved by a balanced amplitude ratio of 1. If deflecting forces act upon the output element, then the floating state, in which the frictional contact between the friction element and the output element is released from the static friction and the output element remains at the same location, if necessary, is obtained by adjusting a certain inclination of the vibration path of the friction element.

It can be advantageous if in the second step of the method the amplitude ratio of the periodic control voltages is starting out from a first value continuously changed to a second value, where the first value preferably corresponds to the amplitude ratio of the periodic control voltages in the first step. The inclination of the vibration path of the friction element is adjusted by way of the amplitude ratio of the periodic control voltages. A continuous change in the amplitude ratio accordingly causes a continuous change in the inclination of the vibration path of the friction element. Due of the non-existent or hardly existing static friction in the floating state between the friction element and the output element, the output element can already be adjusted in motion by a slight inclination of the vibration path of the friction element. As a result, a gentle start-up of the output element can then be achieved without jerky motions. Short operating displacement and/or low propulsion speeds of the output element can thereby also be obtained.

It can furthermore also prove to be advantageous if the first step and/or in the second step of the method the periodic control voltages have substantially the same or exactly the same frequency, where this frequency is preferably higher than the electrical resonance frequency of a piezoceramic element of the piezoelectric motor or an ultrasonic actuator in the ultrasonic motor system.

The piezoelectric motor or the piezoelectric ultrasonic actuator can in the range of its respective driving electrode be regarded as a generator for an acoustic standing wave so that the corresponding range represents a partial actuator. Each of the two partial actuators represents an impedance which when excited with the resonance frequency forms an ohmic resistor.

The periodic control voltages are applied to these partial actuators via at least one source that is adjustable in frequency, amplitude and phase. When operating the ultrasonic motor with periodic control voltages, the frequency of which correspond to the resonance frequency of the piezoelectric motor or the piezoelectric ultrasonic actuator, respectively, the current would flow from one source via the two impedances to the other source actuated with a 180° phase shift. Small frequency shifts in the range around the resonance frequency, however, lead to phase rotation between voltage and current of +/−180°, whereby the above-described and advantageous current flow can not be adjusted in a stable manner. It is there to be noted that the resonance frequency of the piezoelectric ultrasonic actuator is not constant, but changes depending on the mechanical and thermal ancillary conditions. This change in a similar manner leads to the above-described disadvantageous phase rotation between the voltage and the current. Therefore, the frequency for controlling the piezoelectric ultrasonic actuator is chosen such that the phase rotation between the controlling voltage and the current varies only slightly with the varying resonance frequency.

An excitation outside and in particular near the resonance frequency is therefore less sensitive to a necessarily always present variation of the electromechanical resonance frequency of the actuator system. This is the prerequisite for being able to adjust the vibration vector of the motion of the friction element in a stable manner. Although the vibration amplitude is greatest in the resonance frequency, the motion vector, however, is in the region of the resonance frequency not target oriented.

The object of the invention mentioned above is according to a second aspect of the invention satisfied by the device according to claim 9. A device for controlling a piezoelectric motor by way of at least two driving electrodes by applying periodic control voltages to the driving electrodes is disclosed, where the device is configured to automatically carry out the method according to one of the preceding claims. According to the invention, this device is not only suitable for this purpose, but is also set up or configured to automatically carry out the method according to one of the preceding embodiments, in particular when propulsion of the output element of the piezoelectric motor is requested (e.g. by a user or a control device).

It can be advantageous to have the device comprise a control device which is configured to first apply the periodic control voltages with a phase shift to the driving electrodes and then to change the amplitude ratio of the periodic control voltages with respect to the first step, preferably when propulsion of the piezoelectric motor is requested. The control device is preferably programmed in such a way that, in particular during start-up of the output element, it first (in a first step of the method) generates a vibration of the friction element by controlling the phase shift and the amplitude ratio of the periodic control voltages (e.g. from two separate voltage sources), which causes the static friction between the friction element and the output element to be canceled without producing any propulsion (floating state), in order to subsequently (in the second step of the method) modify the vibration path of the friction element by changing the amplitude ratio in such a manner that propulsion of the output element is achieved.

Further advantageous developments of the invention shall arise from combinations of the features disclosed in the claims, the description and the drawings.

BRIEF DESCRIPTION OF THE FIGURES where:

Figure 2:
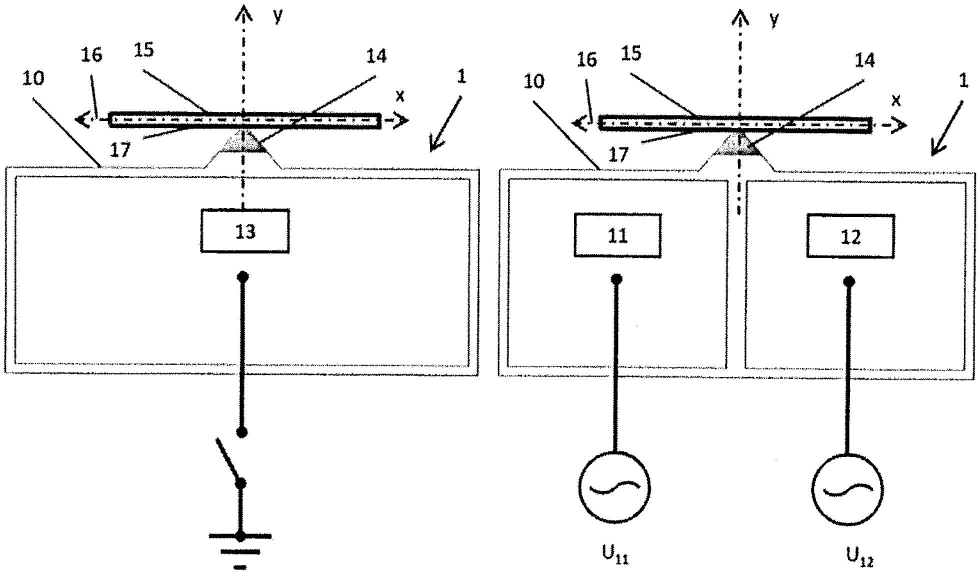
FIG. 2 shows a schematic view of the piezoelectric motor from FIG. 1 with periodic control voltages (sinusoidal alternating voltages) on the so-called driving electrodes, while the so-called ground electrode is earthed.
Figure 3:
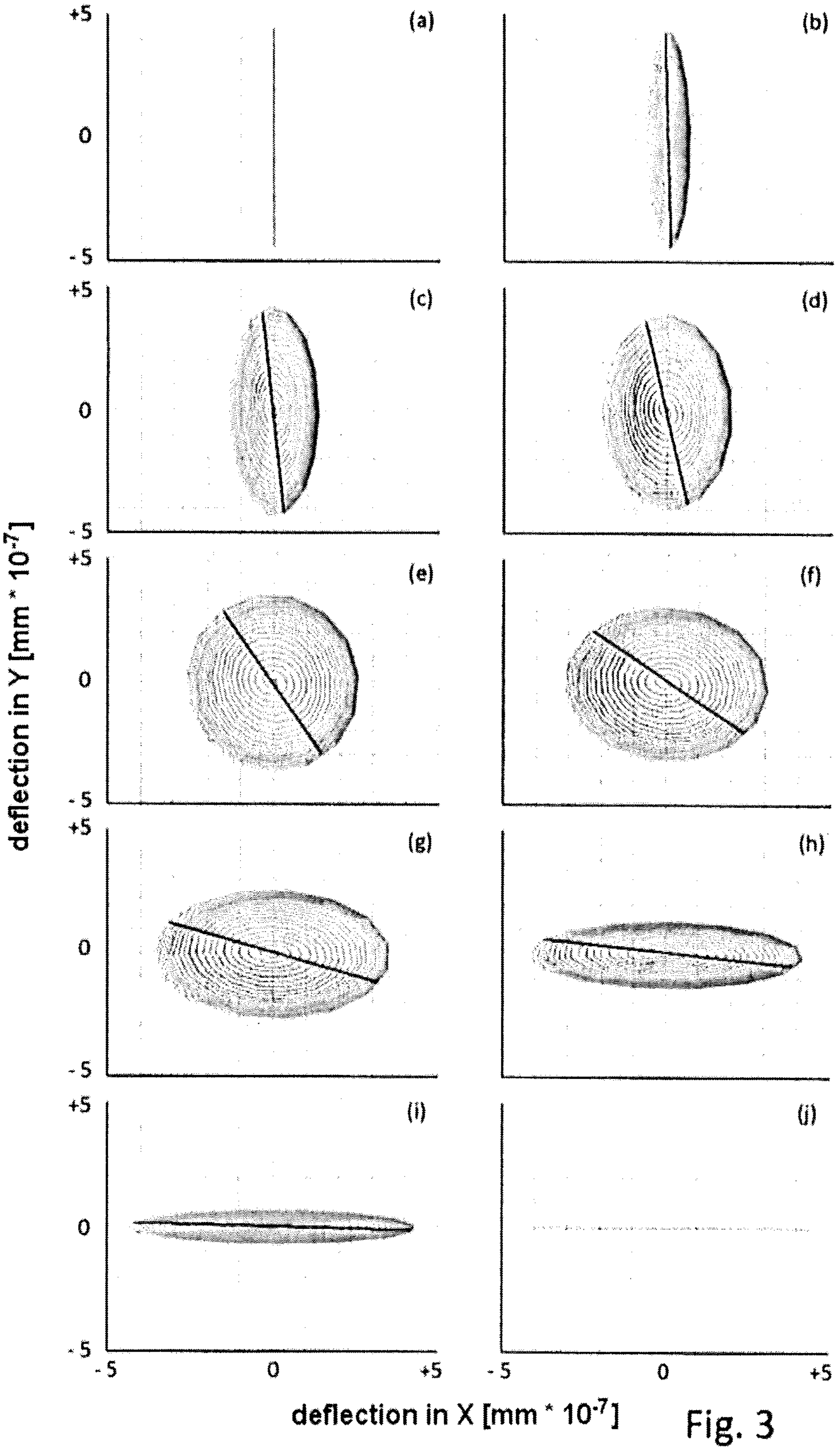

FIG. 3 shows diagrams illustrating a variation of the phase difference of the control voltages applied to the driving electrodes in the range from 0 to 1 from the upper left (a) to the lower right (j), where the main axis of the vibration path of the friction element with a progressive counter-clockwise inclination of the ellipse rotates in the clockwise direction. The individual diagrams (a) to (j) there show the course of the vibration path of the friction element in the X-Y coordinate system with deflection tangentially (X direction, see FIGS. 1 and 2) and transversely relative to the friction surface of the output element (Y direction; see FIGS. 1 and 2) in dependence of the phase difference adjusted.

Figure 4:
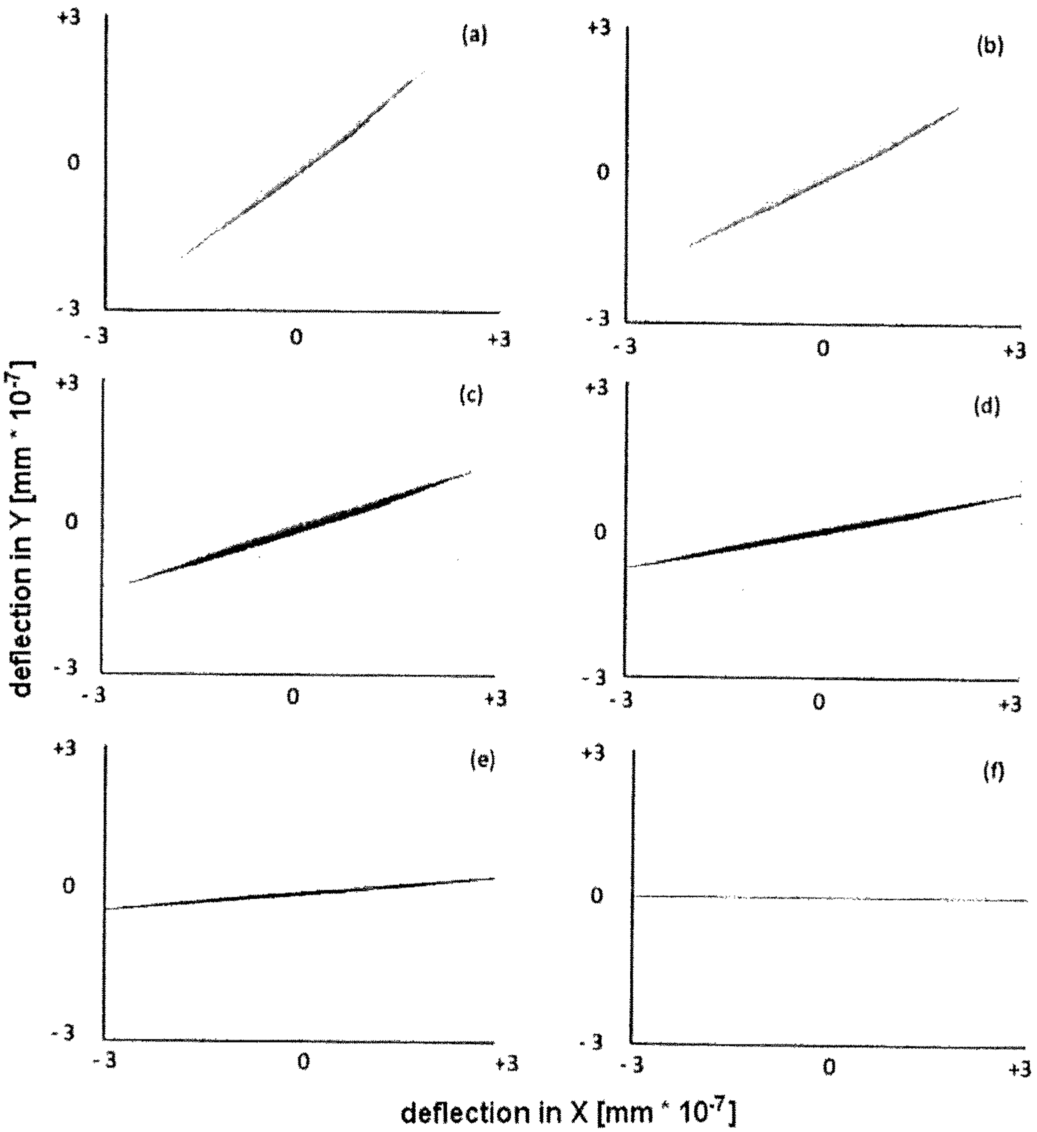

FIG. 4 shows diagrams for illustrating a variation of the amplitude of the excitation of one of the two driving electrodes while the other driving electrode is constantly fully actuated in the range from 0% to 100% at a phase difference of 180° or $\pi$ from the upper left (a) to the lower right (f), where the deflection of the friction element in the Y direction is at an amplitude ratio of 1 (FIG. 4 (*f*)) equal to 0, and the vibration path of the friction element therefore runs tangentially to the friction surface. The individual diagrams (a) to (j) there show the course of the vibration path of the friction element in the X-Y coordinate system with deflection tangentially (X direction, see FIGS. 1 and 2) and transversely relative to the friction surface of the output element (Y direction; see FIGS. 1 and 2) in dependence of the amplitude ratio adjusted.

DETAILED DESCRIPTION OF THE PREFERRED EMBODIMENT

The invention relates to a method and a device for controlling a piezoelectric motor 1 by way of two driving electrodes 11, 12 by applying periodic control voltages to driving electrodes 11, 12. This is in particular a piezoelectric ultrasonic motor with a piezoelectric ultrasonic actuator that is driven at a frequency of, for example, 156 kHz.

Figure 1:
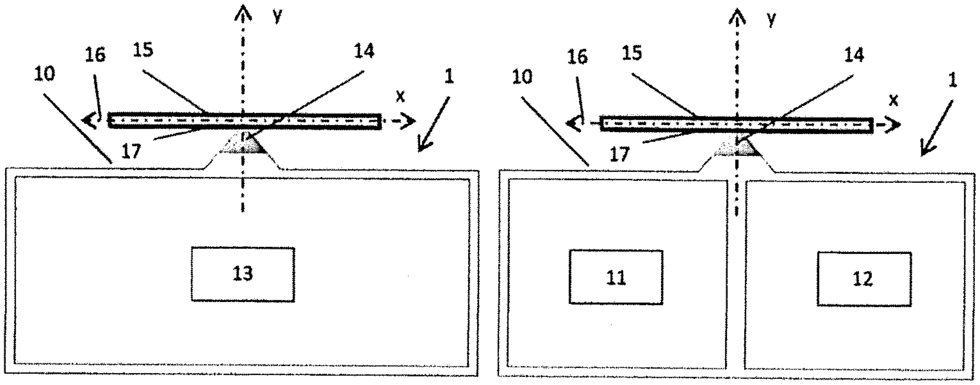
FIG. 1 shows a schematic view of a piezoelectric motor for designation of the electrodes.

A piezoelectric ultrasonic motor 1, to which the method according to the invention is applied, shall be described below with reference to FIGS. 1 and 2.

Piezoelectric ultrasonic motor 1 comprises a total of three electrodes 11, 12, 13. Two of these electrodes 11, 12 are located on one of the two flat sides of an approximately cuboid-shaped piezoceramic element 10 (dimensions, e.g., 25 mm×11 mm×4 mm) and have substantially square surfaces of the same dimensions (e.g., 10 mm×10 mm) and size (e.g. 100 mm$^2$). These electrodes 11, 12, being attached on the flat side are via a control device (not shown) connected to sources for generating periodic alternating voltages (periodic control voltages) U11, U12 and are therefore also referred to as driving electrodes 11, 12. Electrode 13 being arranged on the opposite flat side of piezoceramic element 10 is earthed or connected to ground and is accordingly referred to as a so-called ground electrode 13. If desired, an (in comparison to the actuator impedance) low-resistance resistor (for example, a capacitor) can be interconnected so that electrode 13 need not necessarily be grounded.

Each driving electrode 11, 12 covers substantially one half of this flat side of piezoceramic element 10, where at least a narrow separating region for electrical insulation is provided between the driving electrodes. Driving electrodes 11, 12 are arranged symmetrically to an imaginary center line which runs through a friction element 14 (friction lug) arranged on the longitudinal edge side and centrally of piezoceramic element 10 and defines a Y axis of the actuator system. Ground electrode 13 (dimension, e.g., 20 mm×10 mm) covers substantially the entire area of the other flat side of piezoceramic element 10.

Piezoceramic element 10 is supplied with electrical voltage by way of selectively actuating driving electrodes 11, 12 via the control unit with periodic control voltages U11, U12. Due to the piezoelectric property of piezoceramic element 10, the electrical voltage is transformed into a periodic mechanical deformation which leads to a vibration of friction element 14. Depending on the phases, amplitudes and frequencies of periodic control voltages U11, U12, the vibration path comprises motion components in the X direction and/or in the Y direction.

An output element 15 to be driven is via a friction contact coupled to friction element 14 and can move along a path of motion 16 which defines an X direction. This path of motion 16 is preferably oriented approximately or exactly parallel to the longitudinal edge side of piezoceramic element 10 from which friction element 14 protrudes. The side of output element 15 being in frictional contact with friction element 14 is hereinafter also referred to as friction surface 17. It can in the present case be assumed that path of motion 16 is arranged in a horizontal plane and runs parallel to the longitudinal edge side as well as parallel to the two flat sides of piezoceramic element 10 which are equipped with electrodes 11, 12, 13. Furthermore, it can in the present case be assumed that no deflecting forces act upon output element 15. Accordingly, output element 15 remains in the balance of forces at the same spot when the frictional contact between friction element 14 and output element 15 is released from the static friction.

When a periodic control voltage U11 or U12 is applied between one of electrodes 11 or 12 and electrode 13 in accordance with a control signal obtained from the control device, then this control voltage U11, U12 causes mechanical displacement of output element 15 coupled to friction element 14 in a first direction along the path of motion 16. Application of a periodic control voltage U12 between the other electrode 12 or 11 and electrode 13 causes mechanical displacement of output element 15 in an opposite direction along the path of motion 16.

The control device is configured such that the phases, frequencies and amplitudes of periodic control voltages U11, U12 can be varied independently of one another. Periodic control voltages U11, U12 can in particular be applied to driving electrodes 11, 12 in a phase-shifted and amplitude-modulated manner (i.e., with a variable amplitude ratio). Piezoelectric motor 1 can thereby be optimized at different operating ranges and a less friction as well as an improved control behavior can be obtained.

The method according to the invention provides that the most favorable combination in the parameter space is chosen for particularly critical operating situations of piezoelectric motor 1 in order to obtain an improved control characteristic as well as better control behavior. This applies in particular in the event of propulsion of output element 15 with an adjustment distance and/or at a low speed, in which the method according to the invention enables easier controller stabilization.

FIGS. 3 and 4 show diagrams illustrating how variations in the phase difference and the amplitude ratio between periodic control voltages U11, U12 applied to driving electrodes 11, 12 have an effect, for example, on the vibration path of friction element 14 of piezoelectric motor 1 in the XY coordinate system.

The method according to the invention comprises the steps of:

In the first step of the method, starting out from an electrically voltage-free state, periodic alternating voltages U11, U12 having the same frequency of respectively 156 kHz, a phase shift of 180° (or π) and an amplitude ratio of one, are via the control unit applied simultaneously to driving electrodes 11, 12. The inversely phased actuation of the two driving electrodes 11, 12 with the same frequency and amplitude causes friction element 14 to vibrate on its highly eccentric elliptical path with its main axis tangential to friction surface 17 so that the frictional contact between friction element 14 and output element 15 is released from its static friction. If no deflecting forces act upon output element 15, then no propulsion is produced. In this state, output element 15 remains almost contact-free and “floating” at the same spot, so that this state is also referred to as a “floating state”.

In the second step of the method, the elliptical path, along which friction element 14 vibrates, is inclined by changing the amplitude ratio of periodic control voltages U11, U12 applied to driving electrodes 11, 12. As a result, output element 15 is adjusted in motion. The inclination of the path and the resulting propulsion can be controlled by way of the amplitude ratio. The amplitude ratio is, starting out from a value of 1, preferably continuously, i.e. not abruptly, changed, where the amplitude of periodic control voltage U11 applied to a driving electrode 11, 12 preferably remains constant and the amplitude of periodic control voltage U12 applied to another driving electrode 12 is changed.

In an optional third step, the state of maximum static friction can upon reaching a “target window” (i.e. when output element 15 is in the proximity of a desired target position and the distance to the target position is preferably in the range of nanometers) be fully re-established by selectively reducing the “compensation vibration” required for the “floating state”, whereby the advantage of a currentless, self-supporting actuator at a standstill can be achieved.

A device according to the invention is configured such that, in particular in the event that propulsion of the piezoelectric motor 1 is requested, the method according to the invention is automatically executed by way of both aforementioned method steps. A device according to the invention is configured, for example, as a control device which can be coupled to a piezoelectric motor 1 with two driving electrodes 11, 12, in order to feed driving electrodes 11, 12 with periodic control voltages U11, U12 (for example, from separate voltage sources).

When, for example, a user requests propulsion of output element 15 via the control device, then periodic control voltages U11, U12 are via the control device applied in a phase-shifted manner at the same frequency and amplitude to driving electrodes 11, 12 in order to bring about the “floating state” of output element 15. Starting out from this state, the control unit modulates the amplitude ratio of control voltages U11, U12 applied to driving electrodes 11, 12 automatically and without any further action by the user so that the above-described inclination of the vibration plane of friction element 14 is obtained and propulsion of output element 15 in the direction and at the speed requested by the user arises.

As a result, the problem of abrupt and non-linear static friction transition during the start-up of piezoelectric motor 1 can be overcome by the device according to the invention, in particular in the case of small adjustment distances and low speeds so that a higher positional accuracy can be achieved in positioning the output element as compared to conventional devices.

In applying the teaching according to the invention, for example, self-locking systems can be provided which in the normal state are voltage-free. Applying a so-called compensating voltage causes the floating state of output element 15 to arise and the self-locking state is eliminated. In the absence of the compensation voltage, the self-locking state is restored. According thereto, the self-locking system is to be supplied with voltage only when propulsion of output element 15 is to be produced and/or its position is to be corrected, and can otherwise be kept voltage-free. A self-locking system can in accordance with the invention thereby be operated with minimum energy expenditure.

LIST OF REFERENCE NUMERALS

1: piezoelectric motor
10: piezoceramic element
11: driving electrode
12: driving electrode
13: ground electrode (earthed)
14: friction element
15: output element
16: path of motion of the output element
17: friction surface
U11: periodic control voltage
U12: periodic control voltage

The invention claimed is:

1. A method for controlling a piezoelectric motor by way of at least two driving electrodes by applying periodic control voltages to the driving electrodes the method comprising:
in a first step, applying periodic control voltages with a phase shift to said at least two driving electrodes; and
in a second step, changing an amplitude ratio of said periodic control voltages with respect to the first step, wherein:
in the first step, the phase shift and/or the amplitude ratio of said periodic control voltages is/are adjusted to reduce a static friction of friction contact between a friction element of said piezoelectric motor and an output element to be driven by said friction element without, at a same time, creating a propulsion of said output element, and wherein:
in the second step, the phase shift and/or the amplitude ratio of said periodic control voltages is/are changed in such a way with regard to the first step that a vibration path of said friction element inclines as compared to the first step and thereby produces a propulsion of said output element.

2. The method according to claim 1, wherein:
in the first step, the phase shift and/or the amplitude ratio of said periodic control voltages are adjusted in such a manner that a friction element of said piezoelectric motor is excited to vibrate along a vibration path which extends substantially tangential to a friction surface of an output element to be driven by said friction element.

3. The method according to claim 1, wherein:
in the first step and/or in the second step, said periodic control voltages are applied to said driving electrodes with a constant phase shift, where the phase shift is substantially equal to 180° or exactly equal to 180°.

4. The method according to claim 1, wherein:
in the first step, the amplitude ratio of said periodic control voltages is constant, substantially equal to 1 or exactly equal to 1.

5. The method according to claim 1, wherein:
in the second step, the amplitude ratio of said periodic control voltages starts from a first value that is continuously changed to a second value, where the first value corresponds to the amplitude ratio of said periodic control voltages in the first step.

6. The method according to claim 1 wherein:
in the first step and/or in the second step, said periodic control voltages are applied to said driving electrodes with a constant phase shift.

7. The method according to claim 1, wherein:
in the first step and/or in the second step, said periodic control voltages have substantially the same frequency, where the frequency of said periodic control voltages is outside or substantially equal to the electrical resonance frequency of a piezoceramic element of said piezoelectric motor or an ultrasonic actuator in the ultrasonic motor system, respectively.

8. The method according to claim 2 wherein:
in the first step and/or in the second step, said periodic control voltages are applied to said driving electrodes with a constant phase shift.

9. The method according to claim 8, wherein:
in the first step, the amplitude ratio of said periodic control voltages is constant.

10. The method according to claim 9 wherein:
in the second step, the amplitude ratio of said periodic control voltages starts from a first value that is continuously changed to a second value, where the first value corresponds to the amplitude ratio of said periodic control voltages in the first step.

11. A device for controlling a piezoelectric motor comprising:
two driving electrodes said device being configured to automatically carry out a method which includes:
in a first step, applying the periodic control voltages with a phase shift to said two driving electrodes; and
in a second step, changing an amplitude ratio of said periodic control voltages with respect to the first step, wherein:
in the first step, the phase shift and/or the amplitude ratio of said periodic control voltages is/are adjusted to reduce a static friction of friction contact between a friction element of said piezoelectric motor and an output element to be driven by said friction element without, at a same time, creating a propulsion of said output element, and wherein:
in the second step, the phase shift and/or the amplitude ratio of said periodic control voltages is/are changed in such a way with regard to the first step that a vibration path of said friction element inclines as compared to the first step and thereby produces a propulsion of said output element.

12. The device according to claim 11, comprising:
a control device which is configured to first apply said periodic control voltages with a phase shift to said driving electrodes and then to change an amplitude ratio of said periodic control voltages with respect to the first step, when propulsion of said piezoelectric motor is requested.

13. The device according to claim 11, comprising:
a control device which is configured to first apply said periodic control voltages with a phase shift to said driving electrodes and then to change an amplitude ratio of said periodic control voltages with respect to the first step.

14. The device according to claim 11, wherein:

in the first step and/or in the second step, said periodic control voltages have substantially the same frequency, where the frequency of said periodic control voltages is outside or substantially equal to the electrical resonance frequency of a piezoceramic element of said piezoeletric motor or an ultrasonic actuator in the ultrasonic motor system, respectively.

* * * * *